(12) United States Patent
Hwang et al.

(10) Patent No.: US 6,548,388 B2
(45) Date of Patent: Apr. 15, 2003

(54) SEMICONDUCTOR DEVICE INCLUDING GATE ELECTRODE HAVING DAMASCENE STRUCTURE AND METHOD OF FABRICATING THE SAME

(75) Inventors: Hong-kyu Hwang, Suwon (KR); Young-Rae Park, Suwon (KR); Jung-yup Kim, Seoul (KR); Jeong-sic Jeon, Hwasung-gun (KR); Bo-un Yoon, Seoul (KR); Sang-rok Hah, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 64 days.

(21) Appl. No.: 09/805,213

(22) Filed: Mar. 14, 2001

(65) Prior Publication Data

US 2002/0052085 A1 May 2, 2002

(30) Foreign Application Priority Data

Nov. 2, 2000 (KR) ............................................. 00-65049

(51) Int. Cl.$^7$ ......................................... H01L 21/3205
(52) U.S. Cl. ........................ 438/587; 438/589; 438/595; 438/294; 438/303; 438/442; 438/626; 438/637; 438/648; 438/649; 438/691; 438/692; 438/700
(58) Field of Search ................................ 438/587, 589, 438/595, 626, 630, 631, 634, 648, 649, 692, 700, 294, 683, 303, 442, 637

(56) References Cited

U.S. PATENT DOCUMENTS

| 5,682,055 A | * 10/1997 | Huang et al. ................ 257/408 |
| 5,915,183 A | 6/1999 | Gambino et al. |
| 5,963,818 A | * 10/1999 | Kao et al. .................... 438/424 |
| 6,025,259 A | * 2/2000 | Yu et al. ..................... 438/618 |

* cited by examiner

*Primary Examiner*—Matthew Smith
*Assistant Examiner*—Belur V Keshavan
(74) *Attorney, Agent, or Firm*—Volentine Francos, PLLC

(57) ABSTRACT

A gate electrode conductive layer is formed on an active region that is recessed relative to field oxide layers so as to define a damascene structure. The gate electrode conductive layer is formed on the active region but is not formed on a field region so that the thickness of an interlayer insulation layer deposited in a succeeding process is reduced, thereby reducing or preventing voids within the interlayer insulation layer. A polysilicon is formed on the bottom of the active region by selective epitaxial growth, thereby minimizing the influence of micro scratches, pits or stringers occurring on the bottom of the active region.

18 Claims, 9 Drawing Sheets

SEMICONDUCTOR DEVICE INCLUDING GATE ELECTRODE HAVING DAMASCENE STRUCTURE AND METHOD OF FABRICATING THE SAME

BACKGROUND OF THE INVENTION

1. Field of the Invention

The present invention relates to a semiconductor device including a gate line and to a method for fabricating the same, and more particularly, to a semiconductor device having a conductive layer which forms a gate electrode and has a damascene structure, and to a method of fabricating the semiconductor device.

2. Description of the Related Art

As the size and the design rule of semiconductor devices decrease, so must the size of metal oxide semiconductor field effect transistors (MOSFETs) of such devices. However, in scaling down these MOSFETs, many problems occur during the fabrication, especially when forming a gate line and an interlayer insulation layer after a trench isolation process is performed. Most of these problems can be attributed to the narrow pitch between gate lines, which decreases as the design rule decreases. A conventional method of isolating trench devices and forming a gate line and an interlayer insulation layer is described below.

FIGS. 1 through 7 are cross-sectional views illustrating the structure of a conventional semiconductor device and a conventional method of fabricating the semiconductor device.

Referring to FIG. 1, a pad oxide layer 11 and a polishing stop layer 12 are sequentially stacked on a semiconductor substrate 10. Thereafter, a photoresist pattern (not shown) is formed. The underlying polishing stop layer 12, pad oxide layer 11 and the semiconductor substrate 10 are partially etched using the photoresist pattern as an etching mask, to thereby form a plurality of shallow trenches. Subsequently, an insulation layer to be used as a field oxide layer 14 is deposited on the surface of the semiconductor substrate 10 to fill the trenches and cover the surface of the semiconductor substrate 10.

Chemical mechanical polishing (CMP) is then performed on the semiconductor substrate 10. The CMP process stops at the nitride polishing stop layer 12, thereby defining insulating field regions within the trenches where the field oxide layers 14 are located, and active regions on the semiconductor substrate 10 between the field oxide layers 14.

Referring to FIG. 2, the polishing stop layer 12 and the pad oxide layer 11 on the active region are removed via an etching process. Subsequently, an etch back process, such as CMP, is performed to minimize the step difference between the active region and the field region. Thereafter, a gate oxide layer 16 is formed on the surface of the semiconductor substrate 10.

Referring to FIG. 3, a conductive layer 18 used as a gate electrode, for example, a polysilicon layer, a silicide layer 20 and an upper gate insulation layer 22 are sequentially stacked on the semiconductor substrate 10 having the gate oxide layer 16. The surface of the resultant structure is coated with a photoresist film 24.

Referring to FIG. 4, the photoresist film (24 of FIG. 3) is exposed and developed to form a photoresist pattern (not shown). The upper gate insulation layer, the silicide layer and the gate electrode conductive layer are etched using the photoresist pattern as an etching mask. Accordingly, at least one gate stack 27 composed of the gate oxide layer 16, a gate electrode conductive pattern layer 18', a silicide pattern layer 20' and an upper gate insulation pattern layer 22' is formed on each of the active regions and the field regions. Next, a spacer insulation layer 26 is blanket deposited on the entire surface of the semiconductor substrate 10 having the gate stacks 27.

Referring to FIG. 5, the spacer insulation layer 26 is anisotropically etched, thereby forming gate lines 30 in which gate spacers 26' are formed on the sidewalls of each of the gate stacks 27. Thereafter, the gate oxide layer 16 that is exposed on the semiconductor substrate 10 is etched and removed using the gate lines 30 as an etching mask.

Referring to FIG. 6, an interlayer insulation layer 28, such as an oxide layer, is deposited on the entire surface of the semiconductor substrate 10 having the gate lines 30 so that the gate lines 30 are sufficiently covered with the interlayer insulation layer 28. Step differences occur in the interlayer insulation layer 28 due to the protruding gate lines 30.

Referring to FIG. 7, an etch back process, such as CMP, is performed on the interlayer insulation layer 28, thereby forming a planarized interlayer insulation layer 28'.

This conventional method of fabricating a semiconductor device may exhibit the following problems. First, the pitch between the gate lines 30 becomes narrower as the design rule decreases, which in turn creates larger aspect ratios of the gaps between the gate lines 30. In such cases, voids may be formed within the interlayer insulation layer 28 when attempting to fill the gaps between the gate lines 30.

Second, if there is a step difference between the active region and the field oxide layer 14 due to a variation in the thickness of the polished material layer during the CMP of FIG. 1, stringer defects may occur while the silicide pattern layer 20' and the gate electrode conductive pattern layer 18' of FIG. 4 are being etched. Stringer defects are fatal to the operation of the device. A stringer occurs when a fine scratch is generated on a semiconductor substrate, and a subsequently deposited silicide layer or gate electrode conductive material fills the scratch. In such cases, adjacent gate lines are electrically short-circuited.

Third, micro scratches generated on the field oxide layer 14 and the polishing stop layer 12 during the CMP process of FIG. 1 are not removed in succeeding processes. When the etching process is performed to remove the gate oxide layer 16 of FIG. 5, the micro scratches remain on the active region. These micro scratches result in pitting defects on the surface of the semiconductor substrate.

SUMMARY OF THE INVENTION

To solve the above problems, it is a first object of the present invention to provide a method of fabricating a semiconductor device including a gate electrode having an improved damascene structure.

It is a second object of the present invention to provide a semiconductor device including a gate electrode having a damascene structure manufactured according to the above method.

Accordingly, to achieve the first object of the invention, there is provided a method of fabricating a semiconductor device including a gate electrode having a damascene structure. In the method, a trench is formed by patterning a pad oxide layer and a polishing stop layer formed on a semiconductor substrate. An insulation layer used as a field oxide layer is formed in the trench, and chemical mechanical polishing for shallow trench isolation (STI) is performed, thereby defining an active region and a field region. The polishing stop layer and the pad oxide layer are removed from the active region, thereby forming the active region lower relative to the field region. Then, a gate oxide layer is formed on the surface of the semiconductor substrate. Thereafter, a gate electrode conductive layer is deposited on the entire surface of the semiconductor substrate, and chemical mechanical polishing is performed using the field oxide layer, that is, the field region, as a polishing stop so that the gate electrode conductive layer has a damascene structure. Subsequently, a silicide layer and an upper gate insulation layer are stacked and patterned on the semiconductor substrate, thereby forming different types of gate stacks on the active region and the field region, respectively. Gate lines in which spacers are formed on the sidewalls of each of the gate stacks are formed. A polysilicon layer is formed on the bottom of the active region that is lower than the field region by selective epitaxial growth. An etching stop is formed on the resultant structure by a blanket method. Finally, an interlayer insulation layer is formed on the semiconductor substrate having the etching stop, and is then etched back in a planarization step.

The gate electrode conductive layer is formed of a conductive material such as polysilicon, tungsten (W), titanium (Ti) or titanium nitride (TiN). The gate to electrode conductive layer preferably has a thickness of 500–1000 Å after the chemical mechanical polishing for the damascene structure has been performed.

The gate stack formed on the active region preferably has a structure in which the gate oxide layer, the gate electrode conductive pattern layer, the silicide pattern layer and the upper gate insulation pattern layer are sequentially stacked.

The gate stack formed on the field region preferably has a structure in which the silicide pattern layer and the upper gate insulation pattern layer are sequentially stacked.

It is preferable to perform a chemical mechanical polishing process to etch back the interlayer insulation layer. Preferably, the planarization of the interlayer insulation layer is performed until the surface of the etching stop, or the surface of each of the gate stacks is exposed, or until the remaining interlayer insulation layer reaches a thickness of 500–1500 Å from the surface of the etching stop or the surface of each of the gate stacks.

To achieve the second object of the invention, there is provided a semiconductor device including a gate electrode having a damascene structure. The semiconductor device includes a semiconductor substrate, field oxide layers protruding higher than a plane defined by the surface of the semiconductor substrate, and active regions formed between the field oxide layers on the semiconductor substrate. A first gate line type is formed on the active region, the first gate line type having a structure in which a gate oxide layer, a gate electrode conductive pattern layer, a silicide pattern layer and an upper gate insulation pattern layer are stacked. A second gate line type is formed on each of the field oxide layers, the second gate line type having a structure in which the silicide pattern layer and the upper gate insulation pattern layer are stacked. A polysilicon layer is formed by selective epitaxial growth, thereby filling the active regions that are recessed from the level for the field oxide layers. An etching stop is formed by a blanket method depending on the step differences among the field oxide layers, the polysilicon layer and the first and second gate line types. Then, an interlayer insulation layer is formed on the etching stop to be planarized.

The height of each protruding portion of the field oxide layers from the surface of the semiconductor substrate is the sum of: (a) the thickness of the gate electrode conductive layer, (b) a thickness by which the field oxide layer is etched, beginning when the chemical mechanical polishing for forming the field oxide layer starts until the gate oxide layer is completed, and (c) a thickness by which the field oxide layer is dished and lost during the chemical mechanical polishing process for forming the field oxide layer. The thickness of the polishing stop is preferably 500–2000 Å.

According to the present invention, the gate electrode conductive layer is formed to be recessed relative to the field oxide layer so that the height of the gate line is reduced. Therefore, the problem where voids are formed within the interlayer insulation layer during the formation thereof can be overcome. In addition, the polysilicon layer is formed by selective epitaxial growth (SEG) on the surface of the active region, on which defects such as micro scratches or pits occur on the semiconductor substrate, to form the gate line. Therefore, the occurrence of process defects such as stringers or pits can be suppressed.

BRIEF DESCRIPTION OF THE DRAWINGS

The above objectives and advantages of the present invention will become more apparent by describing in detail a preferred embodiment thereof with reference to the attached drawings in which.

DETAILED DESCRIPTION OF THE PRESENT INVENTION

Hereinafter, an embodiment of the present invention will be described in detail with reference to the attached drawings. The present invention is not restricted to the following embodiment, and many variations are possible within the sprit and scope of the present invention. The embodiment of the present invention is provided in order to more completely explain the present invention to anyone skilled in the art.

The present invention can be embodied in ways other than the embodiment of this specification without departing from the spirit and essential features of the present invention. For example, in the preferred embodiment, a silicide layer included in a gate line is formed of WSix or TiSix, but it may be formed of a metal such as W or TiN. In another aspect, a chemical mechanical polishing (CMP) process is used when a gate electrode conductive layer is formed by a damascene method in this embodiment, but a similar process such as dry etching or wet etching may be used instead. Accordingly, the preferred embodiment described below is described by an example, and should not be construed as limiting the scope of the invention.

Prior to setting forth the present invention in detail, terms used in this invention will be clearly defined. A gate electrode defines a conductive layer formed on a gate oxide layer and is formed of polysilicon in the embodiment below.

A gate stack defines a gate pattern before gate spacers are formed. In the embodiment below, a gate stack formed on an active region is referred to as a first gate stack type, and a gate stack formed on a field region is referred to as a second gate stack type.

A gate line defines a gate pattern in which gate spacers are formed on the sidewalls of a gate stack. A gate line formed on an active region is referred to as a first gate line type, and a gate line formed on a field region is referred to as a second gate line type.

FIGS. 8 through 20 are cross-sectional views illustrating the structure of a semiconductor device including a gate electrode having a damascene structure according to an embodiment of the present invention and a method of fabricating the semiconductor device.

Figure 1:
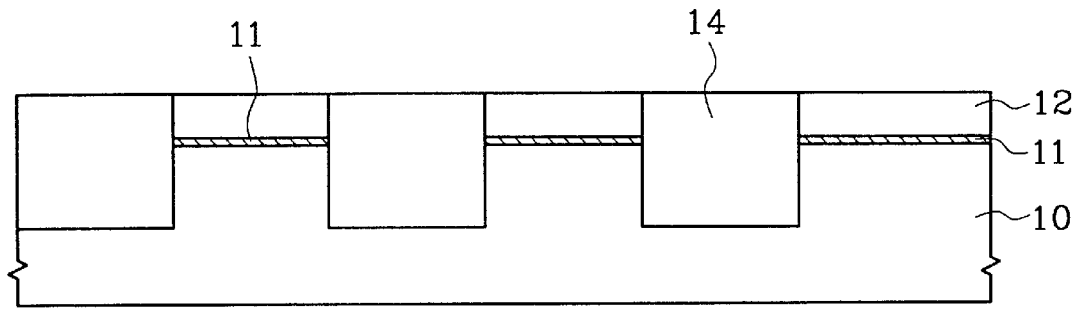
FIGS. 1 through 7 are cross-sectional views illustrating the structure of a conventional semiconductor device and a conventional method of fabricating the semiconductor device.
Figure 2:
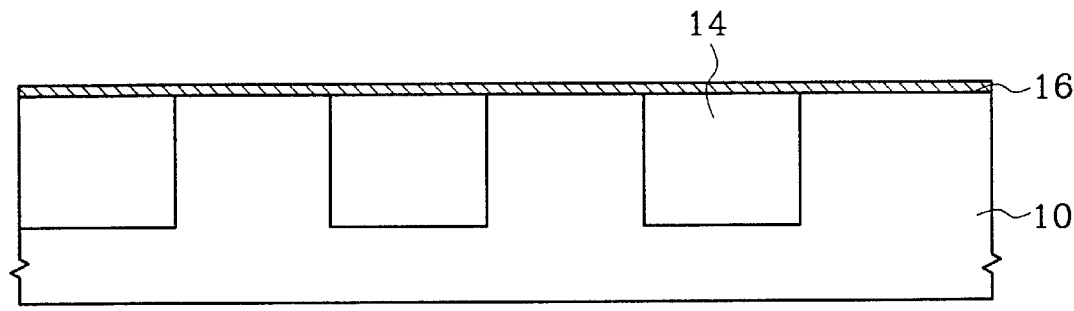
Figure 3:
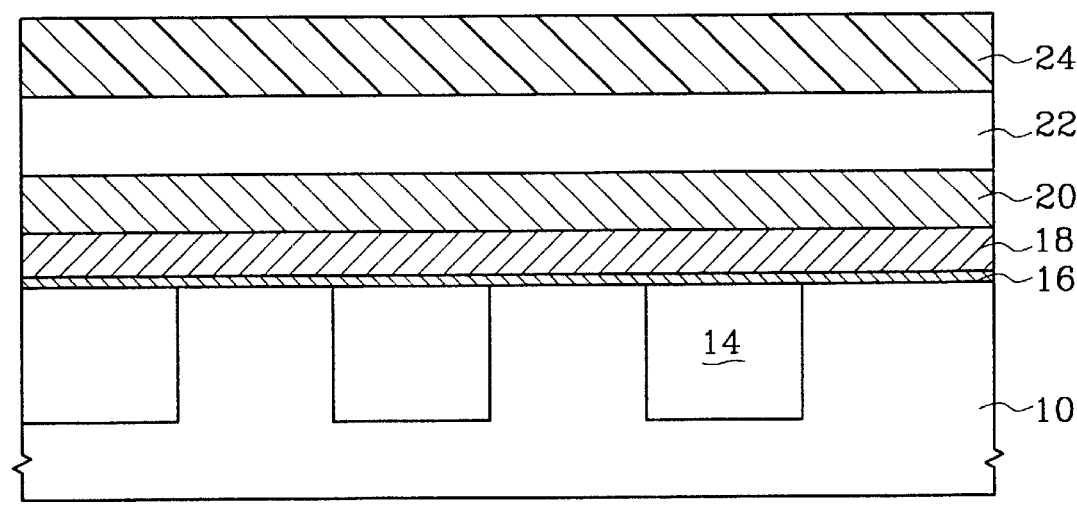
Figure 4:
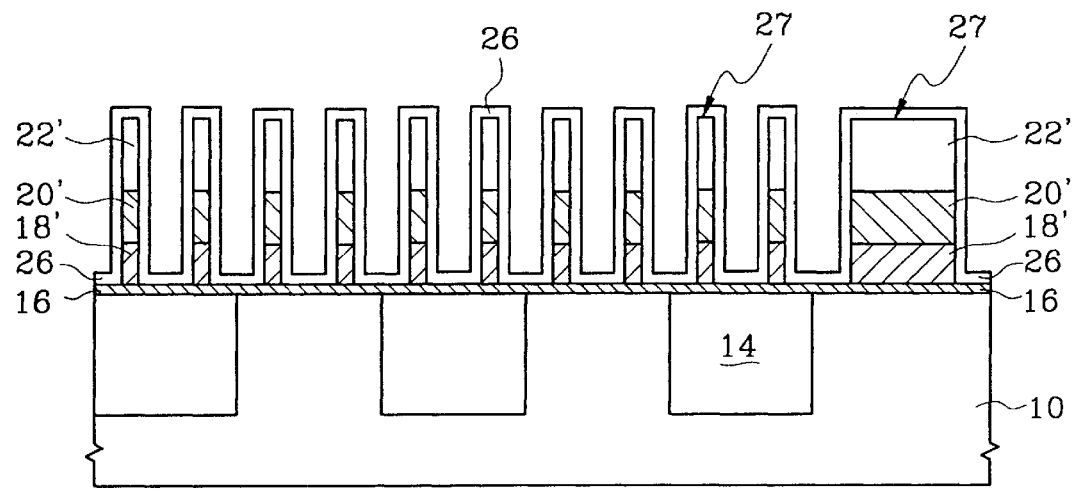
Figure 5:
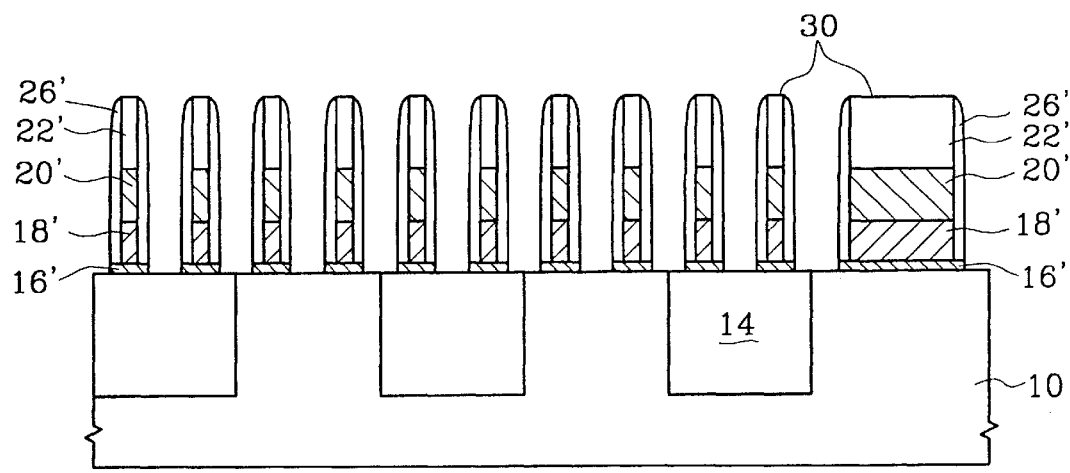
Figure 6:
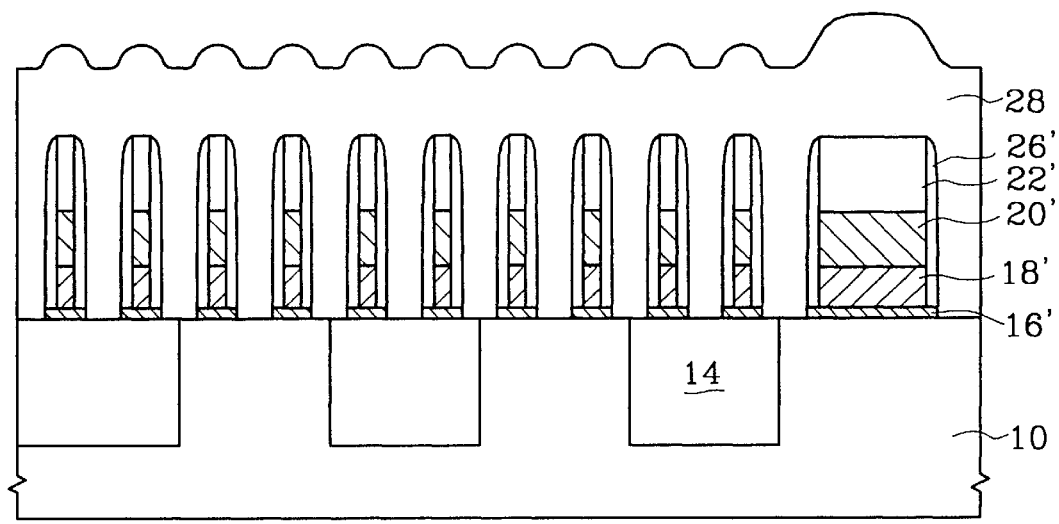
Figure 7:
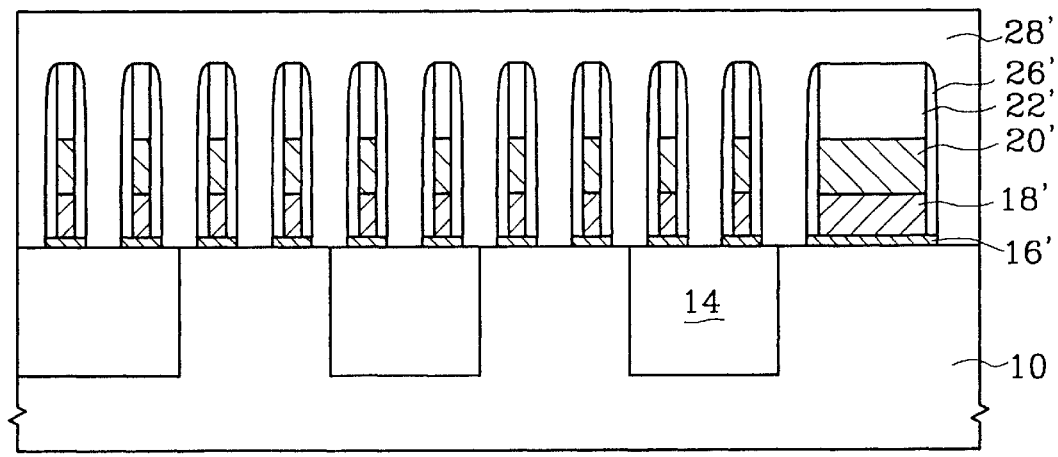
Figure 8:
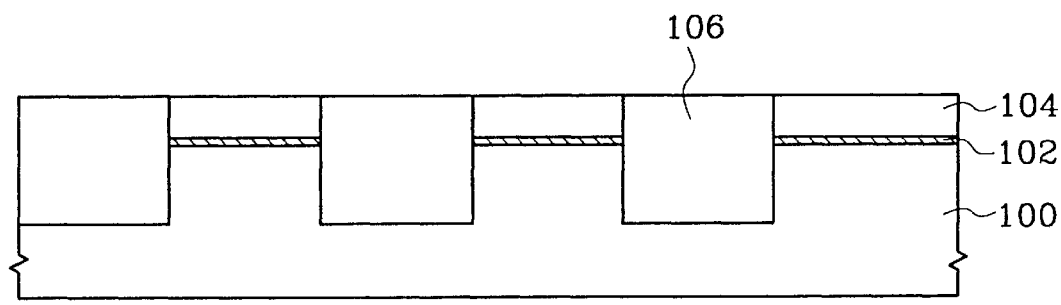
FIGS. 8 through 20 are cross-sectional views illustrating the structure of a semiconductor device including a gate electrode having a damascene structure according to an embodiment of the present invention and a method of fabricating the semiconductor device.

Referring to FIG. 8, a pad oxide layer 102 and a polishing stop 104 are sequentially formed on a semiconductor substrate 100.

Subsequently, a photoresist pattern (not shown) used for forming a shallow trench is formed on the polishing stop 104. The polishing stop 104, the pad oxide layer 102 and the semiconductor substrate 100 are partially etched using the photoresist pattern as an etching mask, thereby forming shallow trenches to be filled with a field oxide layer 106. The polishing stop 104 is preferably formed of a material having a polishing rate that is lower, relative to the field oxide layer 106, during CMP for shallow trench isolation (STI). The preferred polishing stop 104 is formed of nitride (SiN) or oxy-nitride (SiON).

An insulation layer used as the field oxide layer 106 is deposited on the entire surface of the semiconductor substrate 100 having the shallow trenches. Here, the insulation layer is preferably deposited to a sufficient thickness for filling the trenches and covering the surface of the semiconductor substrate 100.

The insulation layer used as the field oxide layer 106 may be formed of one selected from the group of oxide layers including a spin on glass (SOG) layer, an undoped silicate glass (USG) layer, a boron phosphorus silicate glass (BPSG) layer, a phosphor silicate glass (PSG) layer, a plasma enhanced tetra-ethyl-ortho-silicate (PE-TEOS) layer, and a flowable oxide layer or a multilayer including selected from the group of oxide layers. The oxide layers may be formed by a chemical vapor deposition (CVD) method, a reflow method, or a deposition method using high density plasma (HDP) equipment. Thereafter, the insulation layer used as the field oxide layer 106 is polished by a CMP process, thereby defining active regions and field regions.

As the name implies, during the CMP process, the polishing stop 104 functions as an end point for the polishing process. It is preferable that the thickness of the remaining polishing stop 104 after the CMP process is 500–2000 Å. The thickness of the remaining polishing stop 104 after the CMP process is necessary for the field oxide layer 106 to define gate electrodes according to a damascene method and is important in the present invention.

In other words, the thickness of the remaining polishing stop 104 is the sum of: (a) 0–200 Å, which is the amount the field oxide layer 106 is dished during the CMP process; (b) 100–500 Å, which is the thickness by which the field oxide layer 106 is consumed during subsequent processes of growing a first gate oxide layer, implanting ions for well formation and threshold voltage adjustment, and growing a second gate oxide layer; and (c) 500–1000 Å, the thickness of a gate electrode. In this embodiment, the CMP process is performed such that the thickness of the remaining polishing stop 104 after the CMP process is about 1000 Å.

Figure 9:
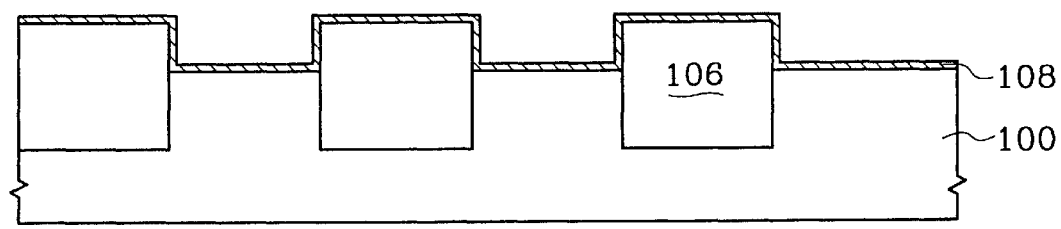

Referring to FIG. 9, the polishing stop 104 is removed by a wet etching method using phosphoric acid ($H_3PO_4$), and the pad oxide layer 102 is removed by a wet etching method using a buffered oxide etchant (BOE). The polishing stop 104 and the pad oxide layer 102 may be removed by a dry etching method instead of a wet etching method.

Thereafter, a first gate oxide layer (not shown) is formed on the surfaces of the active regions, and an ion-implantation process is performed to implant impurities into the semiconductor substrate 100. The first gate oxide layer that is damaged during the ion-implantation process is removed by a cleaning process, and a second gate oxide layer 108 is formed on the surface of the semiconductor substrate 100. During the ion-implantation process and the cleaning process, the field oxide layer 106 is etched by about 100–500 Å as described above.

Figure 10:
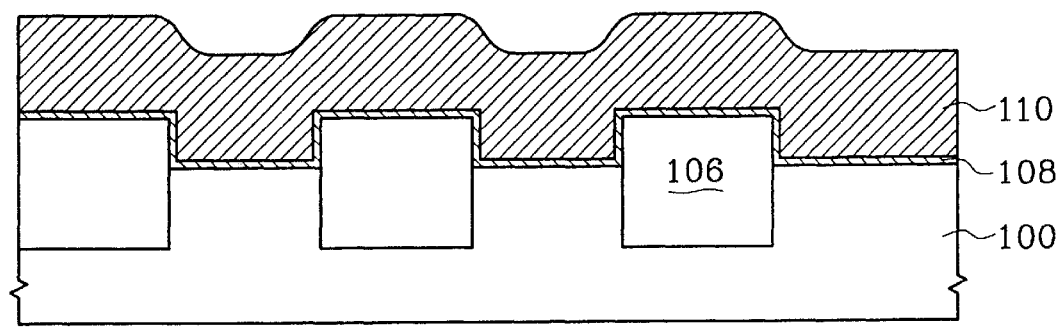

Referring to FIG. 10, a gate electrode conductive layer 110, for example, a polysilicon layer containing impurities, is thickly deposited on the entire surface of the semiconductor substrate 100 having the second gated oxide layer 108, such that the surface of the semiconductor substrate 100 can be sufficiently covered with the gate electrode conductive layer 110.

Figure 11:
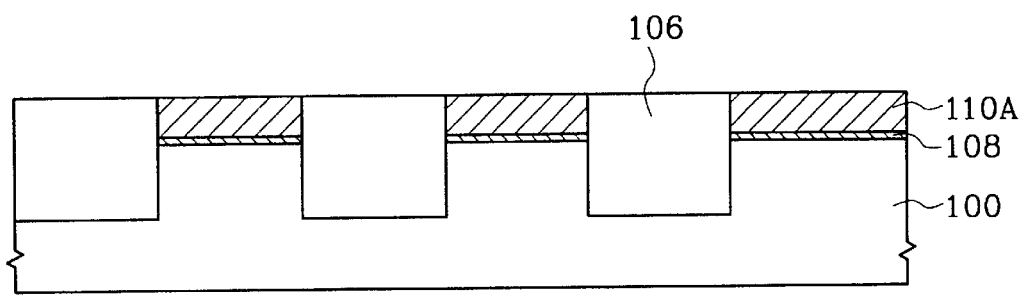

Referring to FIG. 11, an etch back process is performed using the field oxide layer 106 as an etching stop, thereby obtaining a planarized gate electrode conductive layer 110A. For the etch back process, CMP may be performed using a slurry having a high CMP rate over the polysilicon of the planarized gate electrode conductive layer 110A. Accordingly, the planarized gate electrode conductive layer 110A is formed on the semiconductor substrate 100 by the CMP process in a damascene structure.

Preferably, the thickness of the planarized gate electrode conductive layer 110A is 500–1000 Å. The gate electrode conductive layer 110A may be formed of tungsten (W), titanium (Ti) or nitride titanium (TiN) instead of polysilicon containing impurities.

Figure 12:
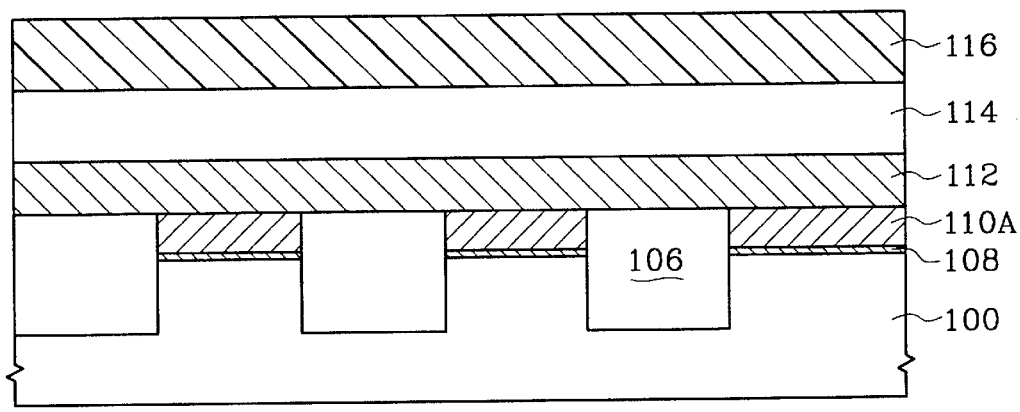

Referring to FIG. 12, a silicide layer 112, an upper gate insulation layer 114 and a photoresist film 116 are sequentially formed on the entire surface of the semiconductor substrate 100 having the gate electrode conductive layer 110A formed by a damascene method. The silicide layer 112 is preferably formed of tungsten silicide (WSix) or titanium silicide (TiSix) to a thickness of 500–1000 Å. It is preferable that the upper gate insulation layer 114 is formed of nitride (SiN) or oxy-nitride (SiON) to a thickness of 500–2500 Å.

Figure 13:
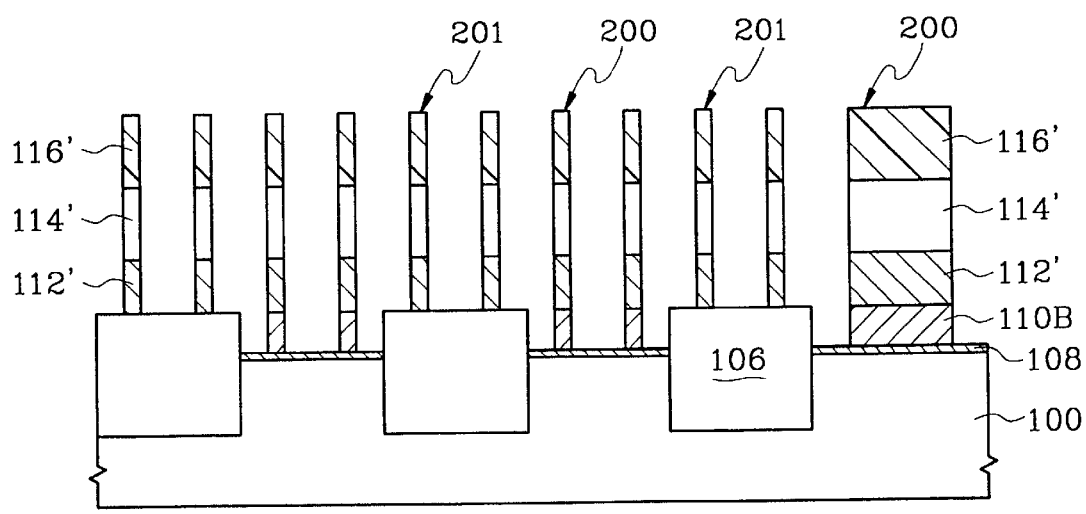

Referring to FIG. 13, the photoresist film 116 is exposed and developed, thereby forming a photoresist pattern 116'. Etching is performed using the photoresist pattern 116' as an etching mask, thereby forming gate stacks 200 and 201 on the active regions and the field regions, respectively. The gate stacks 200 and 201 are formed by etching the upper gate insulation layer 114 and the silicide layer 112 and then etching the gate electrode conductive layer 110A of a damascene structure.

Accordingly, a first gate stack type 200 formed on an active region has a structure in which the gate oxide layer 108, a gate electrode 110B, a silicide pattern layer 112', and an upper gate insulation pattern layer 114' are sequentially stacked. A second gate stack type 201 formed on a field region has a structure in which only the silicide pattern layer 112' and the upper gate insulation pattern layer 114' are sequentially stacked.

Accordingly, the height of the first gate stack type 200 on the active region is lower than in a conventional semiconductor substrate by the thickness of the gate electrode 110B. The lower gate stacks 200 allow a decrease in the thickness of an interlayer insulation layer (124' of FIG. 19). The reduction of the thickness of the interlayer insulation layer suppresses the formation of voids during a gap filling process of filling the gap between gate lines (300 and 301 of FIG. 16).

Figure 14:
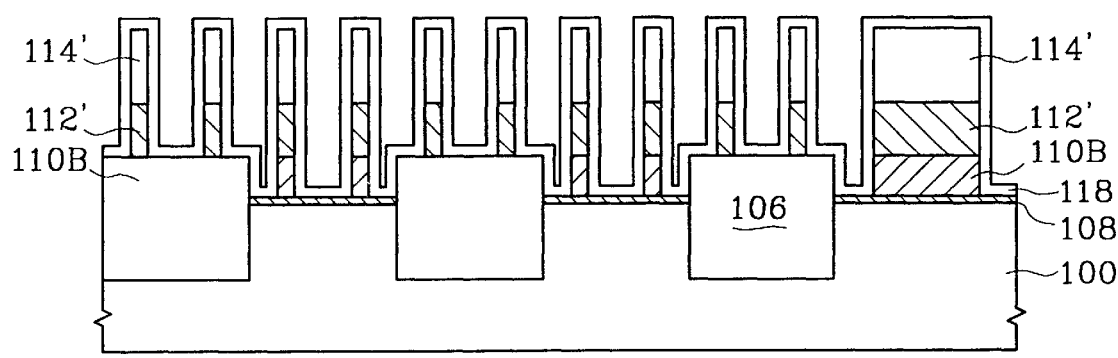

Referring to FIG. 14, the photoresist pattern 116' is removed by an ashing process, and a spacer insulation layer 118 is deposited on the entire surface of the semiconductor substrate 100 by a blanket method. The spacer insulation layer 118 is preferably formed of nitride or oxy-nitride to a thickness of 200–600 Å.

Figure 15:
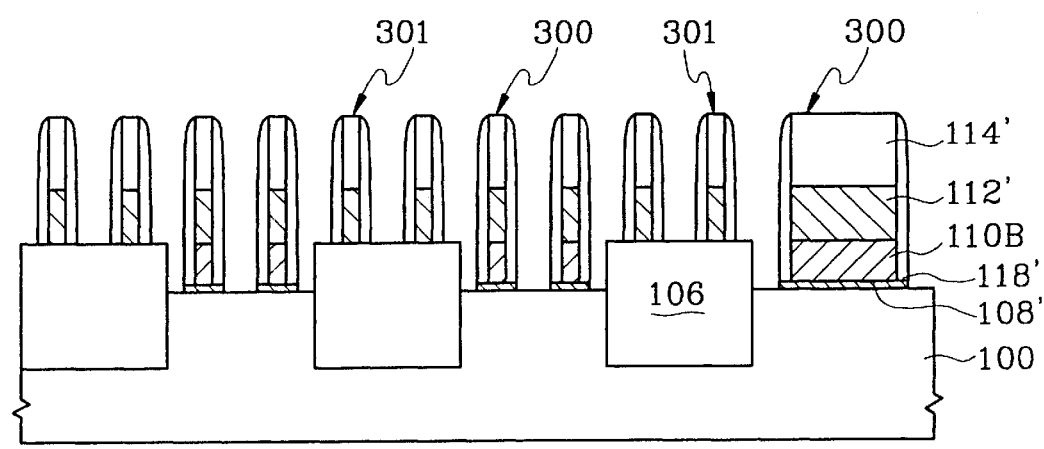

Referring to FIG. 15, the spacer insulation layer 118 is anisotropically etched, and the exposed gate oxide layer 108 is etched, thereby forming first gate lines 300 in which gate spacers 118' are formed on the sidewalls of the gate stacks 200, and second gate lines 301 in which gate spacers 118' are formed on the sidewalls of the gate stacks 201.

Figure 16:
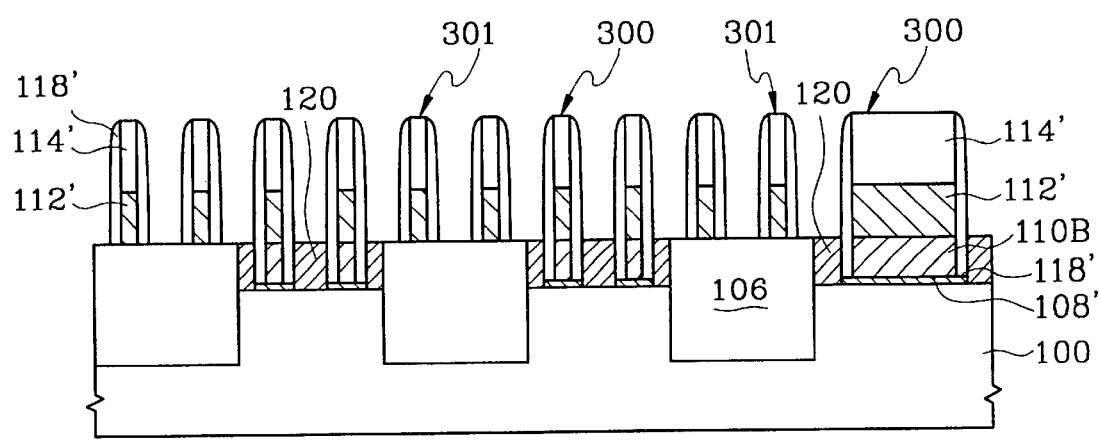

Referring to FIG. 16, by forming the first and second gate lines 300 and 301, silicon, which is the material comprising the semiconductor substrate, is exposed on the surface of the active regions. A polysilicon layer 120 is grown by selective epitaxial growth (SEG) using the exposed silicon on the active region. The polysilicon layer 120 is grown to the same thickness as that of the gate electrode 110B. It is preferable that the thickness of the polysilicon layer 120 is 500–1000 Å.

Growing the polysilicon layer 120 from the bottom of the active regions using SEG is important to achieve the objectives of.the present invention. In other words, the active regions, on which defects such as micro scratches, pits or stringers may occur, is covered with the polysilicon layer 120 formed by SEG so that the influence of the process defects such as micro scratches, pits and stringers can be minimized. And, as described above, the gate electrode 110B formed in a damascene manner is important in reducing the height of the gate lines 300 and 301.

Figure 17:
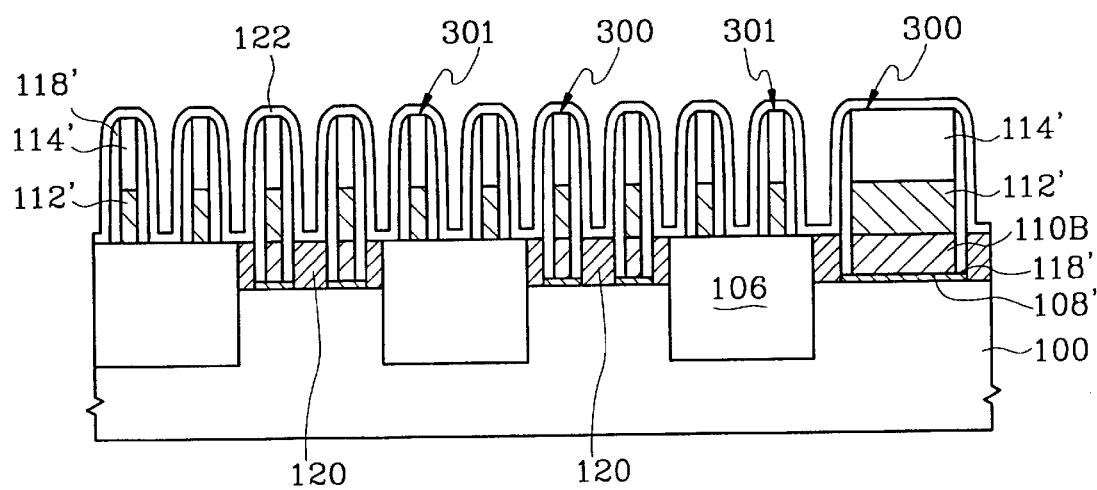

Referring to FIG. 17, an etching stop 122 is formed on the entire surface of the semiconductor substrate 100 having the polysilicon layer 120 by a blanket method. The etching stop 122 may be formed of silicon nitride (SiN) or silicon oxy-nitride (SiON). The thickness of the preferred etching stop 122 is 100–300 Å. The etching stop 122 stops the etching process during a subsequent self-aligned contact (SAC) etching process of etching an interlayer insulation layer (124 of FIG. 18) to expose the surface of the semiconductor substrate 100.

Figure 18:
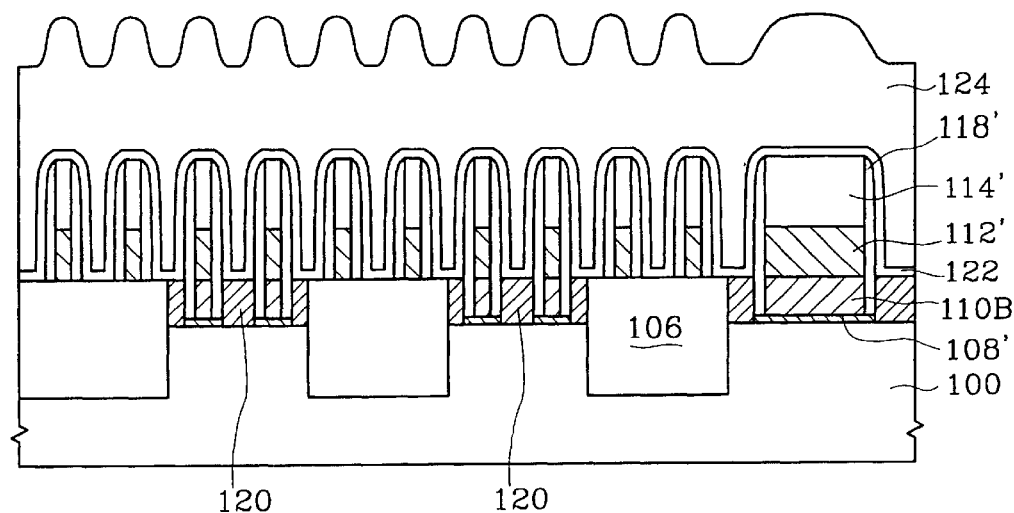

Referring to FIG. 18, an oxide layer selected from the group of oxide layers including a SOG layer, an USG layer, a BPSG layer, a PSG layer, a PE-TEOS layer and a flowable oxide layer is deposited on the semiconductor substrate 100 having the etching stop 122, thereby forming an interlayer insulation layer 124. The interlayer insulation layer 124 may be formed by a CVD method, a reflow method or a deposition method using HDP equipment. It is preferable that the interlayer insulation layer 124 is thickly formed to a thickness of 5000–10000 Å.

Since the gate lines 300 and 301 are lower than in a conventional semiconductor, voids are not formed while the gap between the gate lines 300 and 301 is being filled with the interlayer insulation layer 124. The interlayer insulation layer 124 has a certain step difference depending on the shape of the gate lines 300 and 301.

Figure 19:
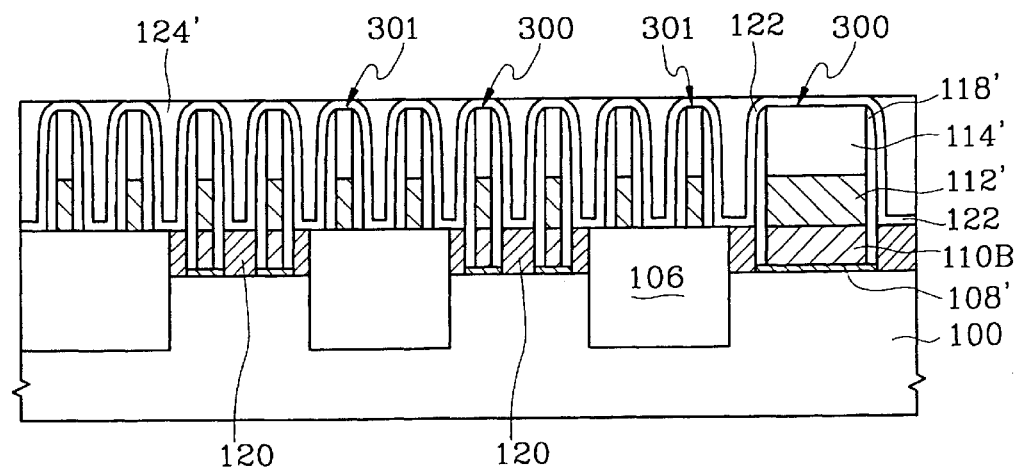

Referring to FIG. 19, an etch back process is performed on the interlayer insulation layer 124, thereby forming a planarized interlayer insulation layer 124'. It is preferable to perform CMP for the etch back process. The interlayer insulation layer 124 is planarized until the surface of the etching stop 122 or the surfaces of the gate stacks 200 and 201 are exposed. Alternatively, the planarization may be performed until the interlayer insulation layer 124' has a thickness of 500–1500 Å from the surface of the etching stop 122 or the surfaces of the gate stacks 200 and 201.

Figure 20:
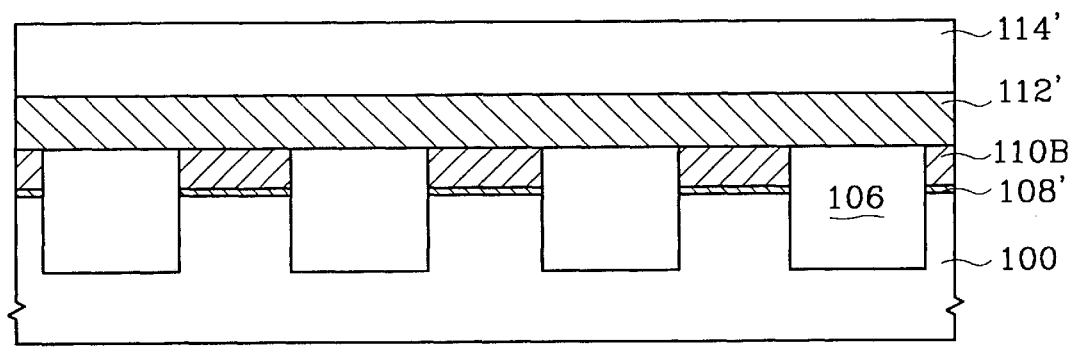

FIG. 20 is a cross-sectional view taken along a line orthogonal to the cross-section of the semiconductor substrate of FIG. 13. Reference numeral 100 denotes the semiconductor substrate, reference numeral 106 denotes the field oxide layer, reference numeral 108' denotes the gate oxide layer, reference numeral 110B denotes the gate electrode, reference numeral 112' denotes the silicide pattern layer, and reference numeral 114 denotes the upper gate insulation pattern layer.

The structure of a semiconductor device including a gate electrode having a damascene structure according to the present invention will be described in detail with reference to FIG. 19. The semiconductor device includes a semiconductor substrate 100; field oxide layers 106 higher than the plane defining the surface of the semiconductor substrate 100; active regions formed between the field oxide layers 106 on the semiconductor substrate 100; first gate line types 300 formed on the active regions, each of the first gate line types 300 having a structure in which a gate oxide layer 108', a gate electrode conductive layer 110B, a silicide pattern layer 112' and an upper gate insulation pattern layer 114' are stacked, and gate spacers 118' are formed on the sidewalls of them; second gate line types 301 formed on the field oxide layers 106, each of the second gate line types 301 having a structure in which the silicide pattern layer 112' and the upper gate insulation pattern layer 114' are stacked, and the gate spacers 118' are formed on the sidewalls of them; a polysilicon layer 120 formed by SEG to fill the active regions recessed between the field oxide layers 106; an etching stop 122 blanketed over the field oxide layers 106, the polysilicon layer 120 and first and second gate lines 300 and 301 depending on their step differences; and an interlayer insulation layer 124' formed and planarized on the etching stop 122.

In the structural features of the semiconductor device including a gate electrode having a damascene structure according to the embodiment of the present invention, the second gate lines 301 do not include the gate electrode 110B, and the gate electrode 110B of each of the first gate lines is formed below the surface of the semiconductor substrate 100 in a damascene manner. Accordingly, the height of the gate lines 300 and 301 is lowered as a whole so that the occurrence of voids can be prevented during a succeeding process of filling the gap between the gate lines 300 and 301 with the interlayer insulation layer 124'.

Another feature of the present invention is to grow the polysilicon layer 120 from the bottom of the active regions using SEG. Process defects such as micro scratches, pits or stringers may occur on the bottoms of the active regions. According to the present invention, the bottoms of these active regions are covered with the polysilicon layer 120 grown by SEG, thereby minimizing the adverse effects of process defects.

Accordingly, the present invention has the following advantages. First, occurrence of voids in an interlayer insulation layer deposited after gate lines are formed can be suppressed. Second, the adverse effects of defects such as micro scratches, pits or stringers can be minimized.

The invention is not restricted to the above particular embodiment, and it will be apparent to one of ordinary skill in the art that modifications to the described embodiment may be made without departing from the spirit and scope of the invention.

What is claimed is:

1. A method of fabricating a semiconductor device, comprising:

forming an insulating layer within a plurality of trenches and over a polishing stop layer, wherein the plurality of trenches are formed in a semiconductor substrate and define respective field regions of the semiconductor substrate, wherein the polishing stop layer is formed over active regions of the semiconductor substrate which are defined between the field regions, and wherein a pad oxide layer is interposed between the polishing stop layer and the semiconductor substrate;

chemical/mechanical polishing the insulating layer so as to remove the insulating layer down to a level of the polishing stop layer, removing the polishing stop layer and the pad oxide layer on the active regions such that a level of the insulating layer within the field regions protrudes above a level of the active regions of the semiconductor substrate, and thereafter forming a gate oxide layer over the active regions and the field regions;

depositing a gate electrode conductive layer over the gate oxide layer;

chemical mechanical polishing the gate electrode conductive layer down to a level of the field regions to define a damascene structure of the gate electrode conductive layer;

stacking and patterning a silicide layer and an upper gate insulation layer on the semiconductor substrate, to form gate stacks on the active regions and the field regions;

forming gate lines in which spacers are formed on sidewalls of each of the gate stacks, and growing a polysilicon layer from a bottom of the active regions using selective epitaxial growth to obtain a resultant structure;

forming an etching stop over the resultant structure;

forming an interlayer insulation layer over the etching stop; and planarizing the interlayer insulation layer using an etch back process.

2. The method of claim 1, wherein the polishing stop layer is formed of one selected from the group consisting of silicon nitride (SiN), silicon oxy-nitride (SiON) and polysilicon, and wherein a polishing rate of the polishing stop layer is less than that of the insulating layer.

3. The method of claim 1, wherein the insulating layer is formed by a process selected from the group consisting of a chemical vapor deposition process, a reflow process and a deposition process using high density plasma equipment.

4. The method of claim 1, wherein the gate electrode conductive layer is formed of a conductive material selected from the group consisting of polysilicon, tungsten (W), titanium (Ti) and titanium nitride (TiN).

5. The method of claim 1, wherein the gate electrode conductive layer has a thickness of 500–1000 Å after the chemical mechanical polishing thereof.

6. The method of claim 1, wherein the silicide layer is formed of one of tungsten silicide (WSix) and titanium silicide (TiSix).

7. The method of claim 1, wherein a thickness of the silicide layer is 500–1000 Å.

8. The method of claim 1, wherein the upper gate insulation layer is formed of one of silicon nitride (SiN) and silicon oxy-nitride (SiON).

9. The method of claim 1, wherein a thickness of the upper gate insulation layer is 500–2500 Å.

10. The method of claim 1, wherein each of the gate stacks formed on the active regions is a first gate stack type having the gate oxide layer, the gate electrode conductive layer, the silicide layer and the upper gate insulation layer sequentially stacked.

11. The method of claim 10, wherein each of the gate stacks formed on the field regions is a second gate stack type having the silicide layer and the upper gate insulation layer sequentially stacked.

12. The method of claim 1, wherein a thickness of the polysilicon layer grown by selective epitaxial growth is equal to a thickness of the gate electrode conductive layer.

13. The method of claim 1, wherein the etching stop is formed of one of silicon nitride (SiN) and silicon oxy-nitride (SiON).

14. The method of claim 1, wherein a thickness of the etching stop is 100–300 Å.

15. The method of claim 1, wherein the etch back process is a chemical mechanical polishing process.

16. The method of claim 1, wherein the etch back process is performed until a surface of the etching stop or a surface of each of the gate stacks is exposed.

17. The method of claim 1, wherein the etch back process is performed until a remaining portion of the interlayer insulation layer has a thickness of 500–1500 Å from the surface of the etching stop or the surface of each of the gate stacks.

18. The method of claim 1, wherein a thickness of the polishing stop layer remaining after the chemical mechanical polishing thereof is 500–2000 Å and is equal to the sum of (a) a thickness of the gate electrode conductive layer, (b) a thickness by which the insulating layer is etched, beginning from when the chemical mechanical polishing of the insulating layer commences until formation of the gate oxide layer is completed, and (c) a thickness by which the insulating layer is dished and lost during the chemical mechanical polishing thereof.

* * * * *